(12) United States Patent
Gomez et al.

(10) Patent No.: US 7,944,665 B2
(45) Date of Patent: May 17, 2011

(54) CONTROL AND PROTECTION SYSTEM FOR AN OUTPUT OF AUTOMATION EQUIPMENT

(75) Inventors: Gérard Gomez, Le Broc (FR);
Jean-Louis Lachenal, Valbonne (FR);
Richard Tonet, Le Rouret (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 468 days.

(21) Appl. No.: 12/128,421

(22) Filed: May 28, 2008

(65) Prior Publication Data

US 2008/0297966 A1    Dec. 4, 2008

(30) Foreign Application Priority Data

Jun. 1, 2007  (FR) ...................... 07 55398

(51) Int. Cl.
*H02H 9/02* (2006.01)
(52) U.S. Cl. ..................................... 361/93.7
(58) Field of Classification Search ............... 361/93.7; 327/538, 427
See application file for complete search history.

(56) References Cited

U.S. PATENT DOCUMENTS

| 4,918,564 | A | 4/1990 | Walker et al. |
| 5,923,210 | A * | 7/1999 | Le et al. ................. 327/538 |
| 6,788,128 | B2 * | 9/2004 | Tsuchida ................. 327/427 |

FOREIGN PATENT DOCUMENTS

| EP | 0 743 751 A2 | 11/1996 |
| EP | 1 184 984 A1 | 3/2002 |

* cited by examiner

*Primary Examiner* — Jared J Fureman
*Assistant Examiner* — Angela Brooks
(74) *Attorney, Agent, or Firm* — Oblon, Spivak, McClelland, Maier & Nuestadt, L.L.P.

(57) ABSTRACT

An electric control and protection system for an output channel of automation equipment, the output channel being capable of controlling an electrical load as a function of a control signal from the automation equipment, the control and protection system including: a device that switches the electrical load including an MOS switching transistor, a source of the MOS switching transistor being connected to a positive voltage terminal via a resistor and a drain of the MOS switching transistor being connected to the electrical load, the MOS switching transistor being switchable between an on-state in which the electrical load is connected to the resistor and an off-state.

8 Claims, 1 Drawing Sheet

CONTROL AND PROTECTION SYSTEM FOR AN OUTPUT OF AUTOMATION EQUIPMENT

Figure 1:
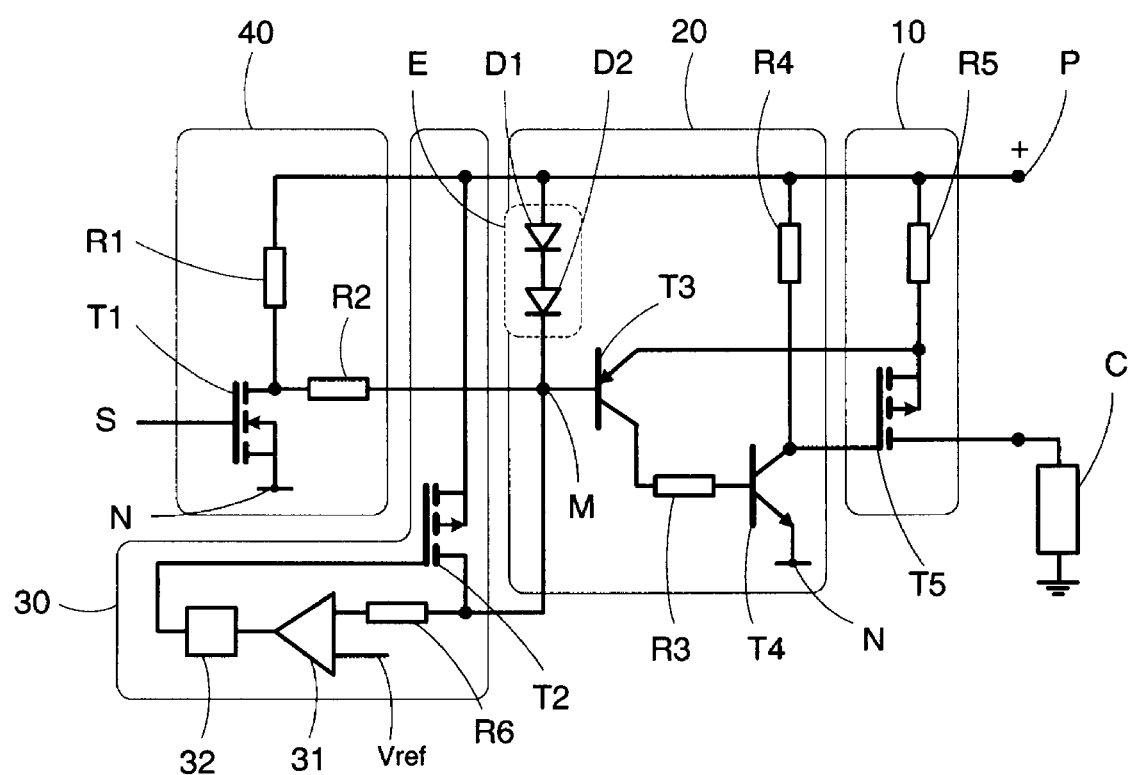

The present invention relates to an electronic control and protection system for an output channel of automation equipment such as an industrial Programmable Logical Controller (PLC), in particular a static output channel capable of controlling an electrical load as a function of a numerical control signal from the automation equipment.

A programmable logical controller is a piece of automation equipment capable of controlling and/or monitoring one or more process(es), in particular in the field of industrial process automation, construction or electrical distribution. It generally comprises a central unit and a certain number of input channels and output channels. When the programmable logical controller is modular in construction, these inputs/outputs may be grouped over the input/output modules, each comprising, for example, 8, 16 or 32 channels.

The inputs allow information to be received, coming in particular from sensors relating to the process. The central unit first scans the inputs, then executes an application program (or user program) with the aim of controlling the outputs, which outputs may control an electrical load of the pre-actuator type, such as an excitation coil of an electromagnetic or other switching device.

The static outputs are protected against overloads and short circuits by an electronic protection system which allows cut-off of the output in the case of fault. Generally, the value of the cut-off current is designed to trip from around 1.25 times the specified maximum current value, i.e. at 125 mA for nominal output currents of 100 mA and 625 mA for 500 mA outputs.

However, this cut-off current value may prove to be disadvantageous in certain cases, in particular for output channels controlling pre-actuators of the capacitive load or filament lamp type. In fact, it is known in the case of a filament lamp, for example, that the resistance of the lamp varies a lot depending on the temperature of the filament, which leads to a great variation in the current flowing through the lamp depending on the temperature of the filament. When the temperature of the filament is low, for example at ambient temperature at the moment of being lit, the resistance of the filament is low and the current flowing through the lamp is therefore very high. The temperature of the filament then increases rapidly and stabilizes, which rapidly increases its resistance and which therefore reduces the current.

Hence, it is considered that the initial value of the peak current likely to flow through the lamp during this start phase can therefore reach five times the nominal current (for example 500 mA for a 24 V DC output with a nominal current of 100 mA) and that the current flowing in the lamp only stabilizes at its nominal value after around 10 ms. Such behaviour may also be encountered on starting for capacitive loads. It is therefore evident that a conventional protection system for an output channel will trip to cut-off.

The aim of the invention is therefore to avoid untimely cut-off of a static transistor output channel during this start phase and to stabilize the current, while guaranteeing its immunity to the power generated by the increase in current flowing through it and hence its deterioration, or even its destruction.

The invention also has the aim of limiting the peak current during the stabilization time so as to avoid the necessity of oversizing the static switching device of the output (such as a transistor) in order to be able to absorb the initial peak current on starting.

To do this, the invention describes an electronic control and protection system for an output channel of automation equipment, the output channel being capable of controlling an electrical load as a function of a control signal from the automation equipment. The system comprises: i) a device for switching the electrical load comprising an MOS switching transistor, the source of which is connected to a positive voltage terminal via a resistor and the drain of which is connected to the load, the switching transistor being switchable between an on-state in which the load is connected to said resistor and an off-state; ii) a limiting device limiting the voltage at the terminals of said resistor to a predetermined maximum value; iii) an output channel cut-off device able to switch the switching transistor to the off-state when the current flowing through said resistor passes a predetermined threshold for a predetermined duration.

According to one feature, the limiting device comprises a bipolar transistor, the emitter of which is connected to the source of the switching transistor and the collector of which is used to control the gate of the switching transistor, and comprises a voltage-drop element connected between the positive voltage terminal and the base of said bipolar transistor, the voltage drop at the terminals of the element being approximately equal to the sum of the base-emitter voltage of said bipolar transistor and the predetermined maximum value at the terminals of said resistor.

According to another feature, the cut-off device comprises a comparison module between the base-emitter voltage of said bipolar transistor and a reference voltage, the output of the comparison module being connected to a timer module, the output of which is connected to the gate of a cut-off MOS transistor.

The invention also relates to automation equipment comprising a central unit and at least one output channel, the central unit being capable of generating a control signal during the execution of a control and/or monitoring program in order to switch said output channel, the automation equipment comprising such an electronic control and protection system for said output channel.

Other features and advantages will appear in the detailed description that follows, referring to an embodiment given by way of example and represented by the appended drawings in which:

FIG. 1 shows an example of the circuit diagram of an electronic control and protection system for an output channel according to the invention.

With reference to FIG. 1, an external electrical load C is capable of being controlled on the basis of a numerical control signal S from an output channel of automation equipment such as a programmable logical controller. The control signal S is generated by the central unit of the programmable logical controller following, for example, the execution of an application program. In a conventional manner, when the value of the control signal S is 1, then the electrical charge C is connected between a positive voltage terminal P, such as a 24 V DC voltage, and earth (or point 0 of this voltage), which means that power is supplied to the load C. Conversely, when the value of the control signal S is 0, the electrical load C is no longer connected to the positive voltage terminal P and power is therefore no longer supplied. An electronic control and protection system is designed to control the electronic output circuit and to protect it against fault from overloading and/or short-circuiting the load C.

The electronic control and protection system comprises a static switching device 10 allowing the electrical load C to be controlled, a limiting device 20 allowing the current flowing into the static switching device 10 to be limited, and a cut-off device 30 allowing the control of the static switching device 10 to be cut in the case of fault.

The switching device 10 comprises a P-channel MOS switching transistor T5, the drain of which is connected to the load C and the source of which is connected to the positive voltage terminal P via a load resistor R5.

The limiting device 20 limits the voltage at the terminals of the load resistor R5 to a predetermined maximum value in such a way as to limit the maximum current flowing through the resistor R5 and therefore the current flowing through the switching transistor T5. It comprises a bipolar PNP transistor T3, a bipolar NPN transistor T4 and a voltage-drop element E. The emitter of the transistor T3 is connected to the source of the transistor T5. The collector of the transistor T3 is connected to the base of the transistor T4 via a resistor R3. The collector of the transistor T4 is connected to the positive terminal P via a resistor R4 and to the gate of the transistor T5. The emitter of the transistor T4 is connected to a negative voltage terminal N of the electronic circuit (for example 19V DC so as to obtain 5 V DC between the terminals P and N).

The base of the transistor T3 forms the point M, which is connected to the positive voltage source P via the voltage-drop element E. In the embodiment of FIG. 1, the element E is composed of two diodes D1 and D2 connected in series between the point M and the positive terminal P. The cathodes of the diodes D1 and D2 are directed towards the point M and the anodes towards the positive terminal P.

The cut-off device 30 comprises an MOS P-channel cut-off transistor T2, the drain of which is connected to the point M and the source of which is connected to the positive terminal P. The cut-off device 30 also comprises a comparison module 31 and a timer module 32. The comparison module 31 has a first input connected to the point M via a resistor R6 and a second input receiving a reference voltage Vref. The output of the comparison module 31 is connected to the input of the timer module 32 and the output of the timer module 32 is connected to the gate of the transistor T2.

Furthermore, the control and protection system also comprises a control device 40 comprising an MOS N-channel transistor T1. The gate of the transistor T1 is connected to the control signal S. The source of the transistor T1 is connected to the negative terminal N of the electronic circuit. The drain of the transistor T1 is connected to the point M via a resistor R2 and to the positive terminal P via a resistor R1. The value of the resistance R2 is very high in order that the drop current of R2 is negligible.

The normal operation of the system is the following:

To begin with, the control signal S is equal to 0, hence the transistor T1 is in the off-state. The base of the transistor T3 is then connected to the positive terminal P via R1 and R2. The transistor T3 is therefore off and the transistor T4 is also off. As the gate of the switching transistor T5 is then connected to the positive terminal P via R4, this entails that the switching transistor T5 is in the off-state and power is not supplied to the electrical load C: the output is not controlled.

When the control signal S shifts to 1, the transistor T1 goes into the on-state. The base of the transistor T3 now finds itself connected to the negative terminal N via the resistor R2. Despite the fact that the value of R2 is very high, the transistor T3 goes into the on-state. The base of the transistor T4 therefore finds itself connected to the positive terminal P via the resistors R3 and R5 and T4 will be in the on-state. As the gate of the switching transistor T5 is then connected to the negative terminal N, this means that the switching transistor T5 is in the on-state, the electrical load C is connected to the positive terminal P via the resistor R5 and is therefore supplied with power: the output is controlled.

The voltage drop $V_E$ at the terminals of the element E is equal to $V_E = V_{BET3} + V_{R5}$, in which $V_{BET3}$ represents the base-emitter voltage of the transistor T3 and $V_{R5}$ represents the voltage at the terminals of the resistor R5. When the transistor T3 is in the on-state and saturated, i.e. when the output is controlled, the voltage drop $V_{BET3}$ between base and emitter is fixed and equal to around 0.6 V.

According to the invention, the voltage-drop element E is chosen in order to provide a drop in voltage $V_E$ determined in order to be able to limit the voltage $V_{R5}$ to the value $V_{R5max}$ in all cases. In the present embodiment, the element E is composed of two diodes D1 and D2 which each provide a constant voltage drop $V_{D1}$ and $V_{D2}$ equal to around 0.6 V, which corresponds to a value usual for this type of component. A limitation of the value of the voltage VR5 is therefore obtained:

$$V_{R5max} = V_E - V_{BET3} = V_{D1} + V_{D2} - V_{BET3} = V_{D1} = 0.6 \text{ V}$$

The maximum current flowing in the resistor R5 is equal to: $I_{R5max} = V_{R5max}/R5 = V_{D1}/R5$. As $V_{D1}$ and R5 are determined, it is possible in this way to limit for a certain time the current $I_{R5}$ flowing through R5 and therefore the current flowing through the switching transistor T5, even in the case of a short-circuit. Hence the transistor T5 does not need to be too great in size, which constitutes a big advantage in terms of heat dissipation and implanting the output channel in an input/output module of the programmable logical controller in order to be able, for example, to install 32 output channels on a single module, each channel being equipped with an electronic control and protection system according to the invention.

In fact, when the load C is short-circuited, then the voltage $V_{DST5}$ between the source and the drain of the transistor T5 is approximately equal to: $V_{DST5} = 24 - V_{R5max}$, in the case where the positive voltage is 24 V DC. The transistor T5 must then just be capable of bearing the following power $P_{max}$ for the duration of the specified time, namely: $P_{max} = V_{DST5} * I_{R5max}$, i.e.: $P_{max} = (24 - V_{R5max}) * V_{D1}/R5$.

By way of example, for 24 V DC outputs at a nominal current equal to 100 mA, a resistance R5 equal to 2.2 ohms (2R2) may be chosen, which provides a current $I_{R5max}$ equal to 270 mA. For 500 mA outputs, the resistance R5 may be equal to 0.4 ohms.

When the output is operating normally and is not short-circuited, the point M (which corresponds to the base of the transistor T3) is at the following voltage: $V_{M1} = 24 - V_{BET3} - V_{R5}$, in which $V_{R5}$ has a low value, because the current consumed by the output is the nominal current. By contrast, when the output is short-circuited, the point M is then at the following voltage: $V_{M2} = 24 - V_{BET3} - V_{R5max}$, with $V_{R5max} = V_{D1} = 0.6$ V.

The point M is connected to the first input of the comparison module 31 via a resistor R6. It is not useful to take account of the resistor R6 because the value of this resistance R6 is very low and the input impedance of the comparison unit 31 is very high. A reference voltage $V_{ref}$ is applied to the second input of the comparison unit 31. This reference voltage $V_{ref}$ is chosen to be between the values $V_{M1}$ and $V_{M2}$ in such a way that the comparison module 31 is able to detect a short-circuit of the output. Hence, in normal operation, the value $V_{M1}$ is less than the reference voltage $V_{ref}$ and the value of the output of the comparison unit is zero. In the case of a short-circuit, the value $V_{M2}$ becomes greater than $V_{ref}$ and the output of the comparison unit is 1. To increase the precision of the cut-off threshold and to make it independent of the temperature, the reference voltage $V_{ref}$ is preferably produced using a base-emitter voltage of another bipolar transistor paired with the transistor T3.

The output of the comparison module 31 then starts the timer module 32, the duration of which is predetermined in order to be capable of overlooking temporary short-circuits capable of arising at the start of certain outputs, for example of around 10 ms. If the short-circuit is still present at the end of the specified time, then the timer module 32 trips and the gate of the transistor T2 is controlled, which has the effect of directly connecting the point M with the positive terminal P. The base of T3 is then connected to the positive terminal P, which has the effect of turning off the transistor T3 and hence shifting the transistor T5 to the off-state. The output is no longer controlled.

Hence in the case of overload or a short-circuit, the control and protection system is capable of cutting the output at the end of the predetermined duration in the timer module 32, in the case that the voltage at the terminals of the load resistor R5 passes beyond a threshold predetermined by the reference voltage $V_{ref}$. In addition, throughout this predetermined duration, the system is capable of limiting the current flowing through the switching transistor T5 and the load resistor R5 to a maximum current $I_{R5max}$ calculated from the voltage drop of the element E.

Other equivalent solutions may be found for producing the voltage-drop element E. For example, it is possible to replace one or each diode D1 and/or D2 of the element E with a bipolar PNP transistor of the same type as T3 and that paired with T3, the voltage drop of which is similar to that of a diode. This bipolar transistor would then be connected in the following manner: Emitter of the transistor in place of the anode of the diode, and collector+base in place of the cathode of the diode. It is also possible to replace the set of two diodes with a Darlington connection or even with a single Zener diode with a drop equal to around 1.3 V, although the voltage drop provided by a Zener diode is less precise.

In addition, the temperature drifts from the voltage drops of the diodes and from base-emitter voltages of bipolar transistors are equivalent. Therefore, this advantageously guarantees that the system continues to function in the same way even in the case of the temperature increasing (for example 80° C.).

It is understood that other variants and improvements in detail may be imagined, and even the use of equivalent means envisaged, without departing from the scope of the invention.

The invention claimed is:

1. An electric control and protection system for an output channel of automation equipment, the output channel being capable of controlling an electrical load as a function of a control signal from the automation equipment, the control and protection system comprising:
   a device that switches the electrical load including an MOS switching transistor, a source of the MOS switching transistor being connected to a positive voltage terminal via a resistor and a drain of the MOS switching transistor being connected to the electrical load, the MOS switching transistor being switchable between an on-state in which the electrical load is connected to said resistor and an off-state;
   a limiting device that limits a voltage at terminals of said resistor to a predetermined maximum value; and
   an output channel cut-off device that switches the switching transistor to the off-state when a current flowing through said resistor passes a predetermined threshold for a predetermined duration,
   wherein the limiting device includes,
      a bipolar transistor, an emitter of which is connected to the source of the switching transistor and a collector of which is used to control a gate of the switching transistor; and
      a voltage-drop element connected between the positive voltage terminal and a base of said bipolar transistor, a voltage drop at terminals of the voltage-drop element being approximately equal to a sum of a base-emitter voltage of said bipolar transistor and a predetermined maximum value at the terminals of said resistor.

2. The electric control and protection system according to claim 1, wherein the voltage-drop element comprises two diodes in series, anodes of which are positioned on a side of the positive voltage terminal.

3. The electric control and protection system according to claim 1, wherein the voltage-drop element comprises a Zener diode, an anode of which is positioned on a side of the positive voltage terminal.

4. The electric control and protection system according to claim 1, wherein the voltage-drop element comprises two bipolar transistors in a Darlington connection.

5. The electric control and protection system according to claim 1, wherein the cut-off device comprises a comparison module that makes a comparison between a base-emitter voltage ($V_{BET3}$) of said bipolar transistor and a reference voltage, an output of the comparison module being connected to a timer module.

6. The electric control and protection system according to claim 5, wherein the cut-off device comprises a cut-off MOS transistor, a gate of which is connected to an output of the timer module, a source of which is connected to the positive terminal, and a drain of which is connected to the base of the bipolar transistor.

7. The electric control and protection system according to claim 1, further comprising:
   a control transistor, a gate of which is connected to the control signal, a source of which is connected to a negative voltage terminal, and a drain of which is connected to the positive voltage terminal via a second resistor and to the base of the bipolar transistor (T3) via a third resistor.

8. Automation equipment comprising:
   a central unit; and
   at least one output channel,
   the central unit being capable of generating a control signal during execution of at least one of a control and monitoring program in order to switch said at least one output channel; and
   the electronic control and protection system for said at least one output channel according to one of the preceding claims.

* * * * *